(12) United States Patent
Khamesra et al.

(10) Patent No.: US 7,737,734 B1
(45) Date of Patent: Jun. 15, 2010

(54) ADAPTIVE OUTPUT DRIVER

(75) Inventors: Arun Khamesra, Bangalore (IN); Badrinarayanan Kothandaraman, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/984,104

(22) Filed: Nov. 9, 2004

Related U.S. Application Data

(60) Provisional application No. 60/531,085, filed on Dec. 19, 2003.

(51) Int. Cl.
 H03K 3/00 (2006.01)
(52) U.S. Cl. ............... 327/108; 327/112; 326/83
(58) Field of Classification Search ........... 327/108, 327/112, 109, 110, 111; 326/82, 83, 87
 See application file for complete search history.

(56) References Cited

U.S. PATENT DOCUMENTS

| | | | |
|---|---|---|---|
| 4,096,402 A | 6/1978 | Schroeder et al. | |
| 4,178,558 A | 12/1979 | Nagashima et al. | |
| 4,264,872 A | 4/1981 | Suzuki | |
| 4,288,804 A | 9/1981 | Kikuchi et al. | |
| 4,477,737 A * | 10/1984 | Ulmer et al. | 327/541 |
| 4,906,863 A * | 3/1990 | Van Tran | 327/539 |
| 4,940,910 A * | 7/1990 | Jiang | 327/262 |
| 4,943,738 A | 7/1990 | Hoshi | |
| 5,061,862 A * | 10/1991 | Tamagawa | 327/541 |
| 5,349,305 A | 9/1994 | Hsiao et al. | |
| 5,412,348 A | 5/1995 | Kasha et al. | |
| 5,440,162 A | 8/1995 | Worley et al. | |
| 5,440,249 A * | 8/1995 | Schucker et al. | 326/81 |
| 5,646,563 A * | 7/1997 | Kuo | 327/157 |
| 5,732,015 A | 3/1998 | Kazerpounian et al. | |
| 5,744,982 A | 4/1998 | Chu | |
| 5,850,365 A | 12/1998 | Reese et al. | |
| 5,892,371 A | 4/1999 | Maley | |
| 5,896,045 A * | 4/1999 | Siegel et al. | 326/81 |
| 5,949,710 A | 9/1999 | Pass et al. | |
| 5,973,534 A * | 10/1999 | Singh | 327/309 |
| 6,023,174 A | 2/2000 | Kirsch | |
| 6,031,394 A * | 2/2000 | Cranford et al. | 326/81 |
| 6,054,888 A * | 4/2000 | Maley | 327/333 |
| 6,064,227 A * | 5/2000 | Saito | 326/68 |
| 6,072,351 A * | 6/2000 | Sharpe-Geisler | 327/328 |
| 6,130,556 A * | 10/2000 | Schmitt et al. | 326/81 |
| 6,175,952 B1 | 1/2001 | Patel et al. | |
| 6,225,850 B1 * | 5/2001 | Opris | 327/356 |
| 6,252,422 B1 | 6/2001 | Patel et al. | |
| 6,292,025 B1 | 9/2001 | Okumura | |
| 6,362,612 B1 * | 3/2002 | Harris | 323/312 |
| 6,388,470 B1 * | 5/2002 | Mattos et al. | 326/81 |
| 6,388,499 B1 * | 5/2002 | Tien et al. | 327/333 |
| 6,400,189 B2 | 6/2002 | McDaniel | |
| 6,483,349 B2 | 11/2002 | Sakata et al. | |

(Continued)

OTHER PUBLICATIONS

USPTO Notice of Allowance for U.S. Appl. No. 10/228,436 (CD02074) dated Mar. 18, 2004; 6 pages.

(Continued)

*Primary Examiner*—Kenneth B. Wells

(57) ABSTRACT

An adaptive output driver has a number of transistors connected in series between a power supply and a ground. An adaptive bias input is coupled to a gate of one of the transistors.

13 Claims, 1 Drawing Sheet

U.S. PATENT DOCUMENTS

| | | |
|---|---|---|
| 6,483,386 B1 | 11/2002 | Cress et al. |
| 6,501,306 B1 | 12/2002 | Kim et al. |
| 6,552,569 B2 | 4/2003 | Wert |
| 6,611,157 B2 | 8/2003 | Usui |
| 6,680,643 B2 * | 1/2004 | Conte et al. ............... 327/539 |
| 6,784,700 B1 * | 8/2004 | Hunt et al. ............... 327/108 |
| 6,801,064 B1 * | 10/2004 | Hunt et al. ............... 327/112 |
| 6,879,191 B2 * | 4/2005 | Davis ..................... 327/112 |

OTHER PUBLICATIONS

USPTO Non-Final Rejection for U.S. Appl. No. 10/228,436 (CD02074) dated Nov. 13, 2003; 6 pages.

USPTO Advisory Action for U.S. Appl. No. 10/228,436 (CD02074) dated Oct. 8, 2003; 3 pages.

USPTO Final Rejection for U.S. Appl. No. 10/228,436 (CD02074) dated Jul. 16, 2003; 8 pages.

USPTO Non-Final Rejection for U.S. Appl. No. 10/228,436 (CD02074) dated Mar. 27, 2003; 9 pages.

USPTO Notice of Allowance for U.S. Appl. No. 10/233,696 (CD02093) dated Apr. 22, 2004; 7 pages.

USPTO Advisory Action for U.S. Appl. No. 10/233,696 (CD02093) dated Mar. 26, 2004; 3 pages.

USPTO Final Rejection for U.S. Appl. No. 10/233,696 (CD02093) dated Jan. 21, 2004; 9 pages.

USPTO Non-Final Rejection for U.S. Appl. No. 10/233,696 (CD02093) dated Oct. 3, 2002; 6 pages.

USPTO Notice of Allowance for U.S. Appl. No. 09/676,539 (CD00135) dated Jul. 15, 2002; 4 pages.

USPTO Non-Final Rejection for U.S. Appl. No. 09/676,539 (CD00135) dated Feb. 26, 2002; 5 pages.

USPTO Non-Final Rejection for U.S. Appl. No. 09/676,539 (CD00135) dated Aug. 21, 2001; 5 pages.

\* cited by examiner

ADAPTIVE OUTPUT DRIVER

RELATED APPLICATIONS

The present invention claims priority on provisional patent application No. 60/531,085 filed on Dec. 19, 2003

FIELD OF THE INVENTION

The present invention relates generally to the field of electronic circuits and more particularly to an adaptive output driver.

BACKGROUND OF THE INVENTION

Conventional output drivers used to convert a low voltage input signal to higher voltage output signal are needed because the transistor operating voltage varies between newer technology integrated circuits and older technology integrated circuits. One solution for building these type of drivers is to use high voltage transistors. This has the drawback that the integrated circuit with the driver then has to have both thick oxide circuits and thin oxide circuits. This results in higher production costs. In addition, these types of driver circuits have reduced switching speed at slow PVT (Process Voltage Temperature) conditions and high noise at fast PVT conditions, because of constant rail to rail gate to source transistor voltage.

Another solution has been to use thin oxide circuits with low voltage transistors. This reduces the production costs. However, this solution requires a bias-p signal and bias-n signal to protect the gate oxides of the transistors. The bias-p signal is set to the difference between the high voltage external IO (Input/Output) power supply and the low voltage internal regulated power supply and the bias-n signal is the low voltage internal regulated power supply. As a result this driver circuit will work with low voltage transistors, but still has reduced switching speeds at slow PVT (Process Voltage Temperature) conditions and high noise because of overdrive conditions at fast PVT conditions, because of the constant gate to source transistor voltage.

Thus there exists a need for driver circuit that does not have reduced switching speed at slow PVT (Process Voltage Temperature) conditions and does not introduce excessive noise at fast PVT conditions.

SUMMARY OF INVENTION

An adaptive output driver has a number of transistors connected in series between a power supply and a ground. An adaptive bias input is coupled to a gate of one of the transistors. In one embodiment, the adaptive bias input includes a p-bias input coupled to a gate of one of the transistors and an n-bias input signal coupled to another gate of another of the transistors. The p-bias input signal has a voltage of two p-threshold drops less than a voltage of the external power supply.

In one embodiment, a pull-up signal has a high voltage equal to the voltage of the external power supply.

In another embodiment, the adaptive bias input is an n-bias input signal with a voltage of two n-threshold drops higher than ground. In one embodiment, a pull-up signal is coupled to one of the transistors. In another embodiment, a pull-down signal is coupled to another of the transistors.

In one embodiment, an adaptive output driver circuit has a number of p-type transistors connected in series. A source of one of the p-type transistors is coupled to a power supply. A number of n-type transistors are connected in series. A drain of one of the n-type transistors is coupled to a drain of a second of the p-type transistors and a source of a second of the n-type transistors coupled to ground. An adaptive p-bias input signal is coupled to a gate of the second of the p-type transistors. In one embodiment, an adaptive n-type input signal is coupled to one of the n-type transistors. In one aspect of the invention, the voltage of the adaptive n-type input signal is two n-threshold drops greater than ground.

In one embodiment, the adaptive p-bias input signal has a voltage of two p-threshold drops less than a voltage of the power supply. In another embodiment, a pull-up signal and a pull-down signal are coupled to the driver circuit. In one embodiment, the maximum voltage of the pull-up signal is equal to the voltage of the power supply. In another embodiment, the minimum voltage of the pull-down signal is equal to ground.

In one embodiment, an adaptive output driver circuit has a number of thin oxide transistors coupled in series. An adaptive p-bias signal is coupled to a gate of one of the thin oxide transistors. An adaptive n-bias signal is coupled to a gate of a second of the thin oxide transistors. An output of the driver is coupled to the thin oxide transistors and has a larger voltage range than an input to the thin oxide transistors. The adaptive p-bias signal may have a voltage equal to an external power supply less two p-channel threshold drops. The adaptive n-bias signal may have a voltage equal to two n-channel threshold drops above ground. The thin oxide transistors may include a first p-channel transistor having a source coupled to an external power supply and a gate coupled to an input signal. The input signal may vary between an external power supply voltage and a voltage of the adaptive p-bias signal.

DETAILED DESCRIPTION OF THE DRAWINGS

Figure 1:
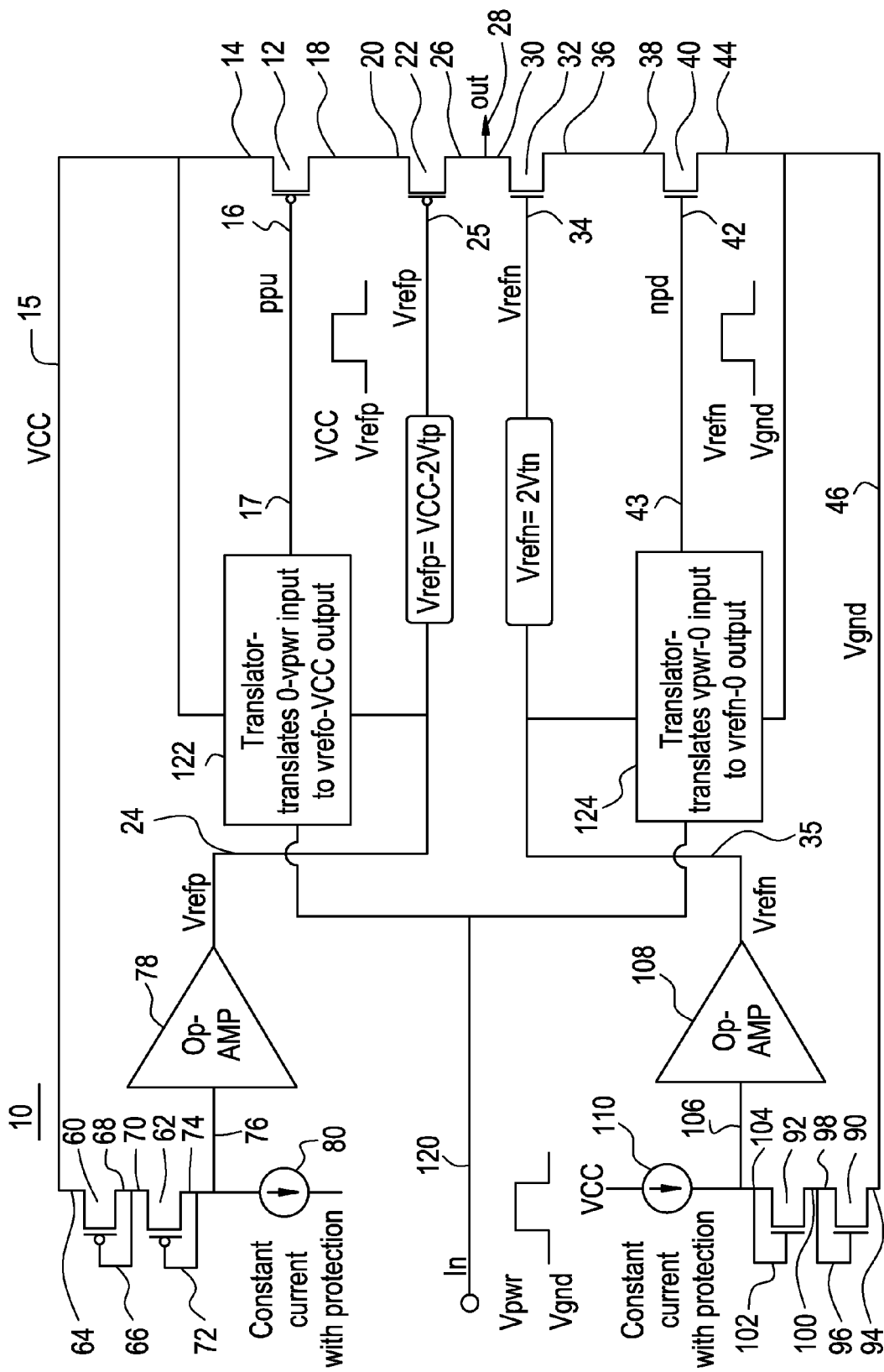
FIG. 1 is an adaptive output driver circuit in accordance with one embodiment of the invention.

An adaptive output driver converts a low voltage internal signal into a high voltage external signal using only low voltage or thin oxide transistors. The present output driver also overcomes the problems of other drivers that use only thin oxide transistors by having an input bias signal based on the threshold voltages of the thin oxide transistors instead of the internal power supply voltage. As a result, the present design does not require a large resistor to generate this bias signal. The present design does not require that the internal power supply stabilize before bias signal can stabilize which results in a slow start-up time. Finally, the present design does not have slow speed at slow process, voltage and temperature conditions and high noise at fast process, voltage and temperature conditions. This is achieved by having the bias signals generated as a function of the threshold voltages for the thin oxide transistors.

FIG. 1 is an adaptive output driver circuit 10 in accordance with one embodiment of the invention. The output driver circuit 10 has a first p-channel transistor 12 with a source 14 coupled to the external high voltage IO power source (Vcc) 15. The gate 16 of the first p-channel transistor 12 is coupled to a pull-up (ppu) signal 17. The voltage range of the pull-up signal 17 is between Vcc (external power supply voltage) and the p-bias (Vrefp) signal 24. The p-bias signal (Vrefp) 24 has a voltage level of the power supply (Vcc) less two threshold (Vtp) drops (Vcc−2Vtp). The drain 18 of the first p-type transistor 12 is coupled to a source 20 of a second p-type transistor 22. The gate 25 of the second p-type transistor 22 is coupled to p-bias signal (Vrefp) 24 which has a voltage level of the external power supply less two p-threshold drops (VCC−Vtp). The drain 26 of the second p-type transistor 22 is coupled to the output 28 and to the drain 30 of an n-type transistor 32. The output 28 is a high voltage signal. The gate 34 of the n-type transistor 32 is coupled to an n-bias signal (Vrefn) 35 that has a voltage of two n-type threshold drops (2Vtn) above the ground supply 46. The source 36 of the n-type transistor 32 is coupled to a drain 38 of a second n-type transistor 40. The gate 42 of the second n-type transistor is coupled to a pull-down signal (npd) 43. The voltage range of the pull-down signal 43 is between ground 46 and the n-bias signal's (Vrefn) voltage 35. The source 44 of the transistor 40 is coupled to ground supply 46.

The p-bias signal (Vrefp) 24 is generated by having two diode coupled p-channel transistors 60, 62 coupled between the external power supply voltage (Vcc) 15 and the gate 25 of the p-channel transistor 22. Thus the source 64 of the p-channel transistor 60 is coupled to the external power supply voltage (Vcc) 15. The drain 68 and the gate 66 of the p-channel transistor 60 is coupled to the source 70 of the p-channel transistor 62. The drain 74 and the gate 72 of the p-channel transistor 62 are coupled an input 76 of an operational amplifier 78 and to a constant current source 80. The output 24 of the operational amplifier 78 is the p-bias signal (Vrefp) 24. The operational amplifier 78 buffers the p-bias signal (Vrefp) 24 and is a sink and source of current.

The n-bias signal (Vrefn) 35 is generated by having two diode coupled n-channel transistors 90, 92 coupled between ground 46 and the gate 34 of the p-channel transistor 32. Thus the source 94 of the n-channel transistor 90 is coupled to ground (Vgnd) 46. The drain 98 and the gate 96 of the n-channel transistor 90 are coupled to the source 100 of the n-channel transistor 92. The drain 104 and the gate 102 of the n-channel transistor 92 are coupled to the input 106 of an operational amplifier 108 and to a constant current source 110. The output 35 of the operational amplifier 108 is the p-bias signal (Vrefp) 35. The operational amplifier 108 buffers the p-bias signal (Vrefp) 35 and is a sink and source of current.

The invention does not rely on any specific circuit to generate the pull-up (ppu) signal 17 and the pull-down (npd) 43. The lower voltage input signal 120 is coupled to a first translator circuit 122 that converts the input signal 120 range of 0-Vpwr to Vrefp-VCC signal 17. A second translator circuit 124 converts the input signal range of 0-Vpwr to 0-Vrefp signal 43. Any of the well-known voltage translator circuits may be used to perform this translation.

In operation the largest overdrive voltage is a p-threshold drop (Vtp) or an n-threshold drop (Vtn). This is true for both fast conditions (low threshold voltages) and for slow conditions (high threshold voltages). As a result, the slow conditions do not slow down the circuit due to higher overdrive and the fast conditions do not result in overdrive that causes noise. The adaptive p-bias (Vrefp) 24 and n-bias (Vrefn) signals 35 provide the ability to adjust for the (PVT) Process Voltage Temperature corner variations. In additions, the generation of the p-bias signal (Vrefp) 24 uses two diode connected PMOS (P-channel Metal Oxide Semiconductor) transistors to create. Some previous techniques require large resistors to create the correct bias signal and limit the standby current. This technique accomplishes this without any large resistors, which take up a large amount of space on the integrated circuit.

Thus there has been described an adaptive output driver circuit that does not have slow switching because of the increased overdrive at slow PVT (Process Voltage Temperature) conditions and does not introduce noise because of the reduced overdrive conditions at fast PVT conditions.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An adaptive output driver comprising:
   a plurality of transistors coupled in series between an external supply voltage and a ground voltage; and
   an adaptive bias input circuit comprising a first operational amplifier with a first constant voltage output and a second operational amplifier with a second constant voltage output, the adaptive bias input circuit being configured to generate a p-bias input signal corresponding to said first constant voltage output coupled to a first gate of a first of the plurality of transistors and an n-bias input signal corresponding to said second constant voltage output coupled to a second gate of a second of the plurality of transistors,
   wherein the p-bias input signal and the n-bias input signal corresponding to said first and second constant voltages, respectively, are each generated from a voltage input signal, wherein the p-bias input signal comprises a voltage equivalent to the difference between the external supply voltage and twice a p-threshold voltage drop, and wherein the n-bias input signal comprises a voltage equivalent to the difference between twice an n-threshold voltage drop and the ground.

2. The driver of claim 1, wherein a pull-up signal is coupled to a gate of one of the plurality of transistors and comprises a first voltage of the external power supply, wherein the first voltage of the external power supply is greater than a second voltage of the external power supply.

3. The driver of claim 1, further comprising a pull-up signal coupled to one of the plurality of transistors.

4. The driver of claim 3, further comprising a pull-down signal coupled to a second of the plurality of transistors.

5. An adaptive output driver circuit, comprising:
   a plurality of p-type transistors coupled in series having a source of the first of the plurality of p-type transistors coupled to an external power supply voltage;
   a plurality of n-type transistors coupled in series, wherein a drain of one of the plurality of n-type transistors is coupled to a drain of a second of the plurality of p-type transistors and a source of the plurality of n-type transistors is coupled to a ground voltage;
   an adaptive p-bias input signal terminal coupled to a gate of the second of the plurality of p-type transistors, wherein the adaptive p-bias input signal is the output of a first operational amplifier configured to receive a first input coupled to a first constant current source, the adaptive p-bias input signal comprises a voltage equivalent to the difference between the external power supply voltage and twice a threshold voltage drop of the plurality of p-type transistors; and
   a second operational amplifier configured to receive a second input coupled to a second constant current source, the adaptive n-bias input signal comprising a voltage equivalent to the difference between the ground voltage and twice a threshold voltage drop of the plurality of n-type transistors.

6. The driver of claim 5, wherein the second operational amplifier is further configured to generate an adaptive n-bias input signal coupled to a gate of one of the plurality of n-type transistors.

7. The driver of claim 6, wherein the voltage of the adaptive n-bias input signal has a voltage equivalent to the difference between two times an n-channel threshold voltage drop and the ground voltage.

8. The driver of claim 5, further comprising:
a pull-up circuit coupled between the output of the first operational amplifier, the gate of the second of the plurality of p-type transistors and the gate of the first of the plurality of p-type transistors a; and
a pull-down circuit coupled between the output of the second operational amplifier, the gate of the second of the plurality of n-type transistors and the gate of the first of the plurality of n-type transistors.

9. The driver of claim 8, wherein the maximum voltage of the pull-up circuit is equal to the voltage of the external power supply voltage.

10. The driver of claim 8, wherein the minimum voltage of the pull-down signal is equal to the ground voltage.

11. An adaptive output driver circuit comprising:
a plurality of thin oxide transistors coupled in series;
an adaptive p-bias signal coupled to a gate of one of the plurality of thin oxide transistors;
an adaptive n-bias signal coupled to a gate of a second of the plurality of thin oxide transistors, wherein the adaptive n-bias signal is an output of an operational amplifier having an input coupled to a current source, the current source coupled to a pair of n-channel diode coupled transistors, wherein the adaptive n-bias signal has a voltage equivalent to the difference between two times a n-channel threshold voltage drop and ground voltage; and
wherein the plurality of thin oxide transistors includes a first p-channel transistor having a source coupled to an external power supply and a gate coupled to an input signal, and wherein the input signal varies between the external power supply voltage and a voltage of the adaptive p-bias signal.

12. The driver of claim 11, wherein an output of the driver is coupled to the plurality of thin oxide transistors and has a larger voltage range than an input to the plurality of thin oxide transistors.

13. The driver of claim 11, wherein the adaptive p-bias signal has a voltage equal to an external power supply less two p-channel threshold drops.

* * * * *